United States Patent

Sakurai

[11] Patent Number: 6,114,907
[45] Date of Patent: Sep. 5, 2000

[54] AMPLIFIER WITH DYNAMIC COMPENSATION AND METHOD

[75] Inventor: Satoshi Sakurai, San Jose, Calif.

[73] Assignee: National Semiconductor Corporation, Santa Clara, Calif.

[21] Appl. No.: 09/207,739

[22] Filed: Dec. 8, 1998

[51] Int. Cl.[7] .................................................. H03F 3/45
[52] U.S. Cl. ............................................ 330/253; 330/292
[58] Field of Search ................................. 330/253, 259, 330/292

[56] References Cited

U.S. PATENT DOCUMENTS 5,146,179   9/1992   Carley et al. ............................. 330/253
5,465,073  11/1995   Satoh ........................................ 330/253
5,486,790   1/1996   Huijsing et al. ......................... 330/260
5,652,545   7/1997   Miyashita et al. ....................... 330/253

Primary Examiner—Robert Pascal
Assistant Examiner—Khanh Van Nguyen
Attorney, Agent, or Firm—Limbach & Limbach L.L.P.

[57] ABSTRACT

A differential amplifier having high gain, short settling time and capable of low voltage operation. A differential transistor pair is connected to an active load which includes two or more casocode connected transistor pairs. Gain boosting amplifiers are connected between the gate and source of one of the load pair so as to increase the effective impedance of the load pair thereby increasing the gain. A compensation capacitor is connected between the gate of each load transistor and the drain of the other load transistor, with the drains having equal and opposite voltage swings. During amplifier slewing, a charge is transferred to and from the gate of the load transistors by way of the compensation capacitors thereby reducing the output settling time.

16 Claims, 4 Drawing Sheets

AMPLIFIER WITH DYNAMIC COMPENSATION AND METHOD

FIELD OF THE INVENTION

The subject invention relates generally to amplifier circuits and, in particular, high speed amplifier circuits capable of low voltage and low power operation.

BACKGROUND ART

Operational amplifiers are key elements in many analog and mixed analog/digital applications. Such amplifiers are commonly required to operate at low power supply voltages where it is difficult to provide large voltage swings necessary for a wide dynamic range. In order to increase the effective voltage swing, fully differential amplifiers are used, such as the conventional amplifier 10 shown in FIG. 1.

Amplifier 10 includes a pair of differentially-connected N type MOS transistors 12A and 12B having gates which receive differential input Vin$^+$ and Vin$^-$, respectively. The sources of transistors 12A and 12B are connected to a common tail current source 13. The drains of transistors 12A and 12B are connected to source of N type transistors 14A and 14B, respectively. Transistors 14A and 14B have gates connected to a common bias voltage $V_{BN}$. Transistors 14A and 14B are thus connected in a common gate configuration so that transistors 12A and 14A form a cascode pair and transistors 12B and 14B form a cascode pair. As is well known, the presence of transistors 14A and 14B increases the effective output impedance as seen by the load of amplifier 10.

The load of amplifier 10 is an active load which comprises P type transistors 16A and 16B, P type transistors 18A and 18B and P type transistors 20A and 20B. Transistor pair 20A and 20B have their sources connected to supply voltage $V_{DD}$ and their gates connected to a common bias voltage $V_{BP1}$. Transistor pair 18A, 18B is connected intermediate pair 16A, 16B and pair 20A, 20B and have their gates connected to another common bias voltage $V_{BP2}$. Transistor pair 16A, 16B is connected intermediate transistor pair 14A, 14B and transistor pair 18A, 18B, with the node intermediate the drains of transistors 16A and 14A forming output Vout$^-$ of the differential output. The node intermediate the drains of transistors 16B and 14B forms output Vout$^+$ of the differential output. The gates of transistors 16A and 16B are connected to another common bias voltage $V_{BP3}$.

In order to achieve the desired high gain, transistors 16A, 18A and 20A are effectively connected in series so as to increase the load impedance seen by transistor 14A. Similarly, transistors 16B, 18B and 20B are connected in series so as to increase the load impedance seen by transistor 14B. If the gain requirements are particularly high, it may be necessary to increase the number of stacked P type transistors of the active load from three to even four or more. In addition, the load transistors 16A, 16B, 18A, 18B, 20A and 20B operate in the saturation region, as opposed to the linear or triode region, so as to provide a relatively high impedance. A transistor is in saturation when the magnitude of the drain-source voltage $V_{DS}$ exceeds the difference between the threshold voltage of the transistor $V_T$ and the gate-source voltage $V_{GS}$.

It is important that all of the transistors have a sufficiently large drain-source voltage $V_{DS}$ to ensure that all of the load transistors remain in the saturation mode. This requires careful selection of the absolute and relative magnitudes of the three bias voltages $V_{BP1}$ $V_{BP2}$ and $V_{BP3}$. This also reduces the dynamic range of the output Vout$^+$ and Vout$^-$ since the maximum output swing is limited to supply voltage $V_{DD}$ less 3*$V_{SAT}$ where $V_{SAT}$ is the minimum drain-source voltage necessary to maintain the transistors in saturation. The maximum voltage swing will be reduced even further if the number of load transistors is increased for the purpose of increasing the gain. This problem is exacerbated by the fact that there is a trend in reducing the size of the supply voltage $V_{DD}$.

Rather than using a large number of P type loads, it has been found possible to increase the gain using gain boosting amplifiers. A further conventional differential amplifier 22 is shown in FIG. 2. Rather than using the three P type active load stages as shown in FIG. 1, two stages are used. A first inverting voltage amplifier A1 is connected between the source and gate of load transistor 16A which operates to increase the impedance of transistor 16A as seen by transistor 14A by a factor equal to the gain of amplifier A1. By way of example, if the voltage at the source of transistor 16A was to increase for some reason, the voltage increase will be amplified and inverted by amplifier A1. The output of amplifier A1 connected to the gate of transistor 16A will thus drop in voltage thereby momentarily turning on transistor 16A harder so that the source of the transistor will drop in voltage, offsetting the original increase. Thus, the gate-source voltage of transistor 16A will tend to remain constant so that the current through transistor 16A will tend to remain constant. Amplifier A1 is thus a gain boosting amplifier as is amplifier A2 connected between the gate and source of transistor 16B.

Amplifier 22 of FIG. 2 provides increased dynamic range over amplifier 10 of FIG. 1 in that the output swing can be greater by one $V_{SAT}$. In addition, high gain is maintained due to the presence of gain boosting amplifiers A1 and A2. However, it has been observed that differential amplifiers such as shown in FIG. 2 provide a poor transient response which is manifested by ringing present at the output.

The present invention provides a significant improvement over the previously-described amplifier circuits. The disclosed amplifier provides high gain and reduced power supply levels with a relatively wide dynamic range. Further, such performance is achieved while maintaining a good transient response. These and other advantages of the present invention will be apparent to those skilled in the art upon a reading of the following Detailed Description of the Invention together with the drawings.

SUMMARY OF THE INVENTION

A differential amplifier having a differential input and a differential output is disclosed. First and second polarity transistors, such as N type MOS transistors, form a differential pair having sources connected to a common tail current source. An active load comprised of MOS transistors of a second polarity, such as P type transistors, is provided having a first P type transistor connected to form a first series path with the first N type transistor. The active load includes a second P type transistor connected to form a second series path with the second N type transistor. First and second amplifier outputs are defined on the first and second series paths at nodes intermediate the P and N type transistors.

The gates of the P type load transistors are electrically isolated from one another. Typically, a gain boosting amplifier is connected between the source and gates of each of the P type load transistors. A first compensation capacitor is connected between the gate of the first P type load transistor and the second amplifier output. A second compensation capacitor is connected between the gate of the second P type load transistor and the first amplifier output.

DETAILED DESCRIPTION OF THE DRAWINGS

Figure 2:
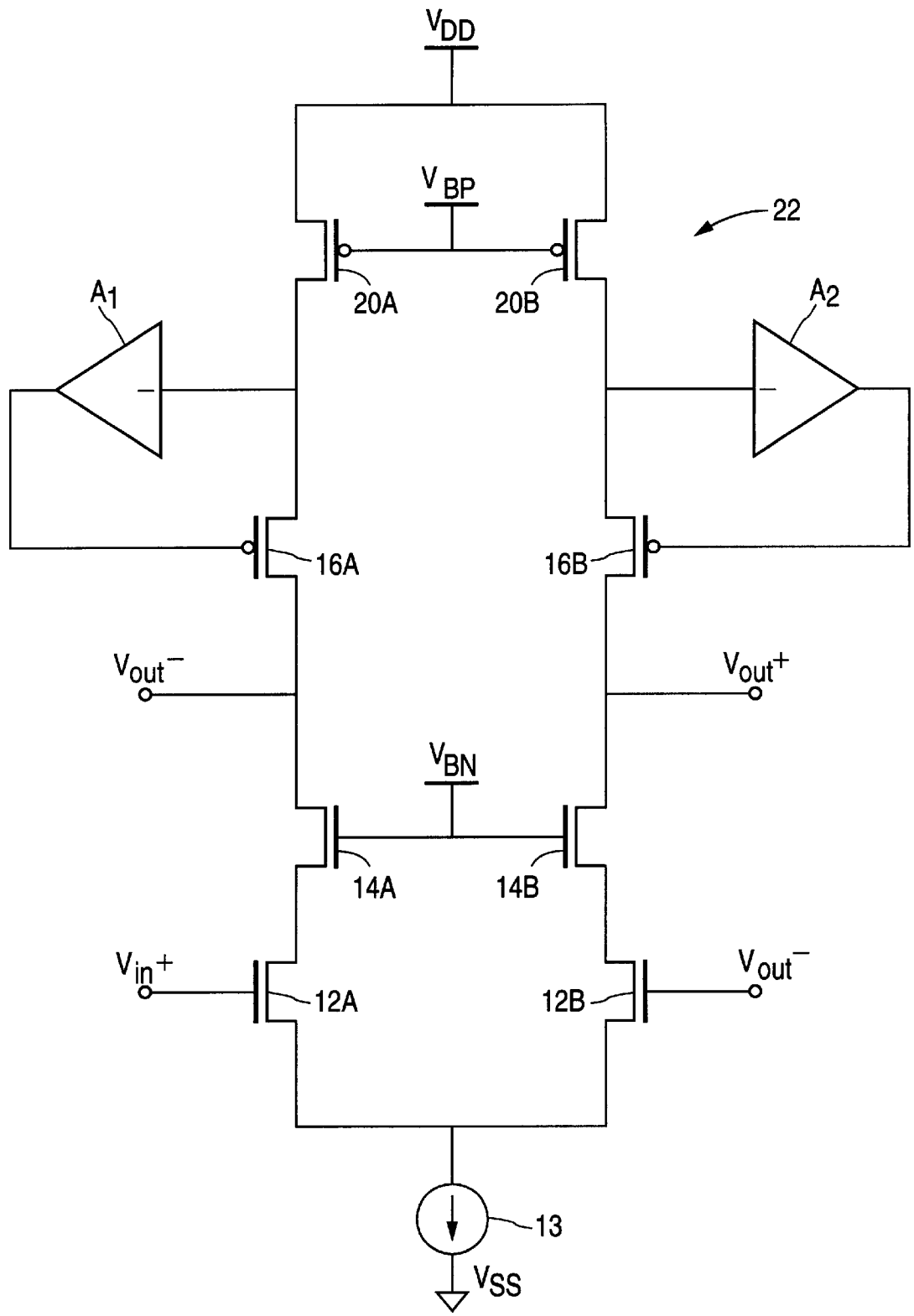
FIG. 2 is a schematic diagram of a conventional fully differential amplifier having a pair of gain boosting amplifiers as part of the active load.
Figure 3:
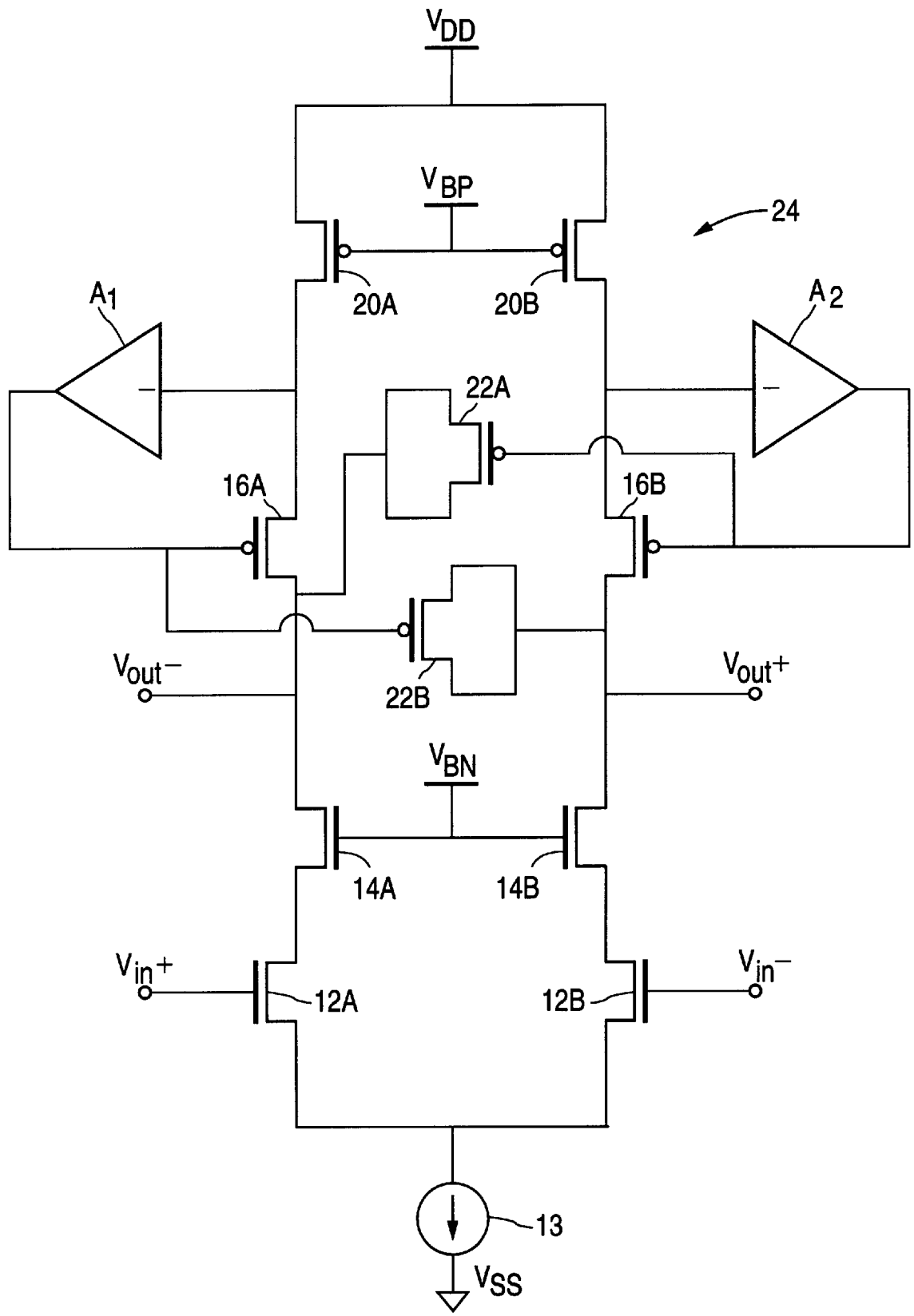
FIG. 3 is a schematic diagram of a fully differential amplifier in accordance with one embodiment of the present invention.

Referring again to the drawings, FIG. 3 is a schematic diagram of one embodiment of the present invention. FIG. 3 is a fully differential amplifier 24 having a pair of differentially-connected N type input transistors 12A and 12B with common gate configured transistors 14A and 14B connected to the input transistors to form cascoded pairs. Amplifier 24 includes an active load comprising a P type transistor pair 20A and 20B and a P type transistor pair 16A and 16B. Transistors 20A and 20B have their gates connected to a common bias voltage $V_{BP}$ and are maintained in the saturation region. Transistor 16A has the source connected to the input of an inverting amplifier A1 and gate connected to the amplifier A1 output. Similarly, transistor 16B has the source connected to the input of inverting amplifier A2 and the drain connected to the amplifier A2 output. Amplifiers A1 and A2 are gain boosting amplifiers which operate to increase the overall gain of amplifier 22 for the reasons previously set forth in connection with FIG. 2.

A compensation capacitor 22A is connected between the drain of load transistor 16A (Vout⁻) and the gate of load transistor 16B. Another compensation capacitor 22B is connected between the drain of load transistor 16B and the gate of load transistor 16A. Capacitors 22A and 22B are formed using a P type transistor, with the drain and sources connected together to form one terminal and with the gate forming the other terminal. Thus, the effective capacitance is approximately equal to the sum of the gate-drain and gate-source parasitic capacitances of the transistors. Transistors 22A and 22B are preferably one half the size of transistors 16A and 16B so that the total capacitance provided by each of the transistors 22A and 22B approximately equals the gate-drain capacitance of transistors 16A and 16B.

Figure 4A:
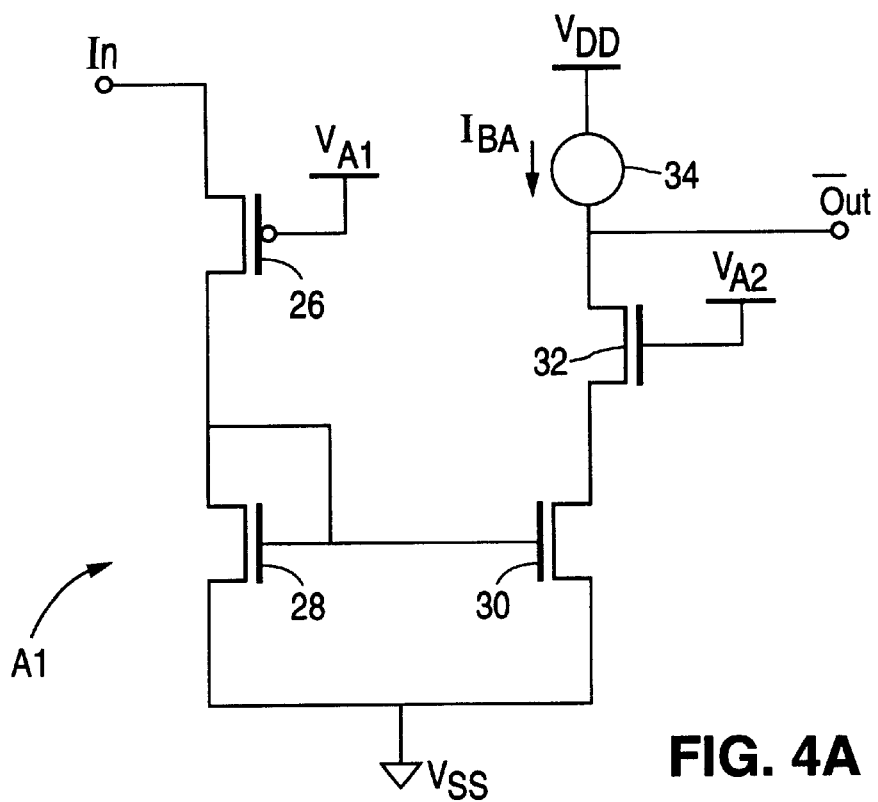
FIGS. 4A and 4B are schematic diagrams of first and second embodiments, respectively, of a gain boosting amplifier for use in the FIG. 3 differential amplifier.

FIG. 4A is a schematic diagram of one implementation of the gain boosting amplifiers A1 and A2. The following description is for open loop operation of the gain boosting amplifiers although actual operation in amplifier 24 is closed loop. The source of a P type transistor 26 functions as the boost amplifier input In. The gate is connected to a bias voltage $V_{A1}$, so that a drain source current $I_{DS}$ is produced in transistor 26 which is proportional to the input In produced at the gate of transistor 16A (or 16B). N type transistors 28 and 30 form a current mirror so that the drain source current $I_{DS}$ of transistor 30 is proportional to In. Cascode connected transistor 32, having a gate connected to a second bias voltage $V_{A2}$, connects the output of the current mirror to the amplifier output $\overline{\text{Out}}$. A bias current source 34 is also connected to the output so that if the mirror output current of transistor 30 drops to less than the current source output $I_{BA}$ due to a decrease in In, $\overline{\text{Out}}$ will increase in voltage. Conversely, if the mirror output current increases due to an increase in In, $\overline{\text{Out}}$ will decrease in voltage.

The voltage level of input In of amplifier A1 is maintained at a level sufficiently below supply voltage $V_{DD}$ to ensure that load transistor 20A will remain in the saturation region. The level of input In (FIG. 4A), the source voltage of transistor 26, is determined by the gate bias voltage $V_{A1}$, and the magnitude of the current through transistor 26 which is determined by the magnitude of current $I_{BA}$. Thus, gain boosting amplifier A1 effectively sets the source voltage of load transistor 16A.

Figure 1:
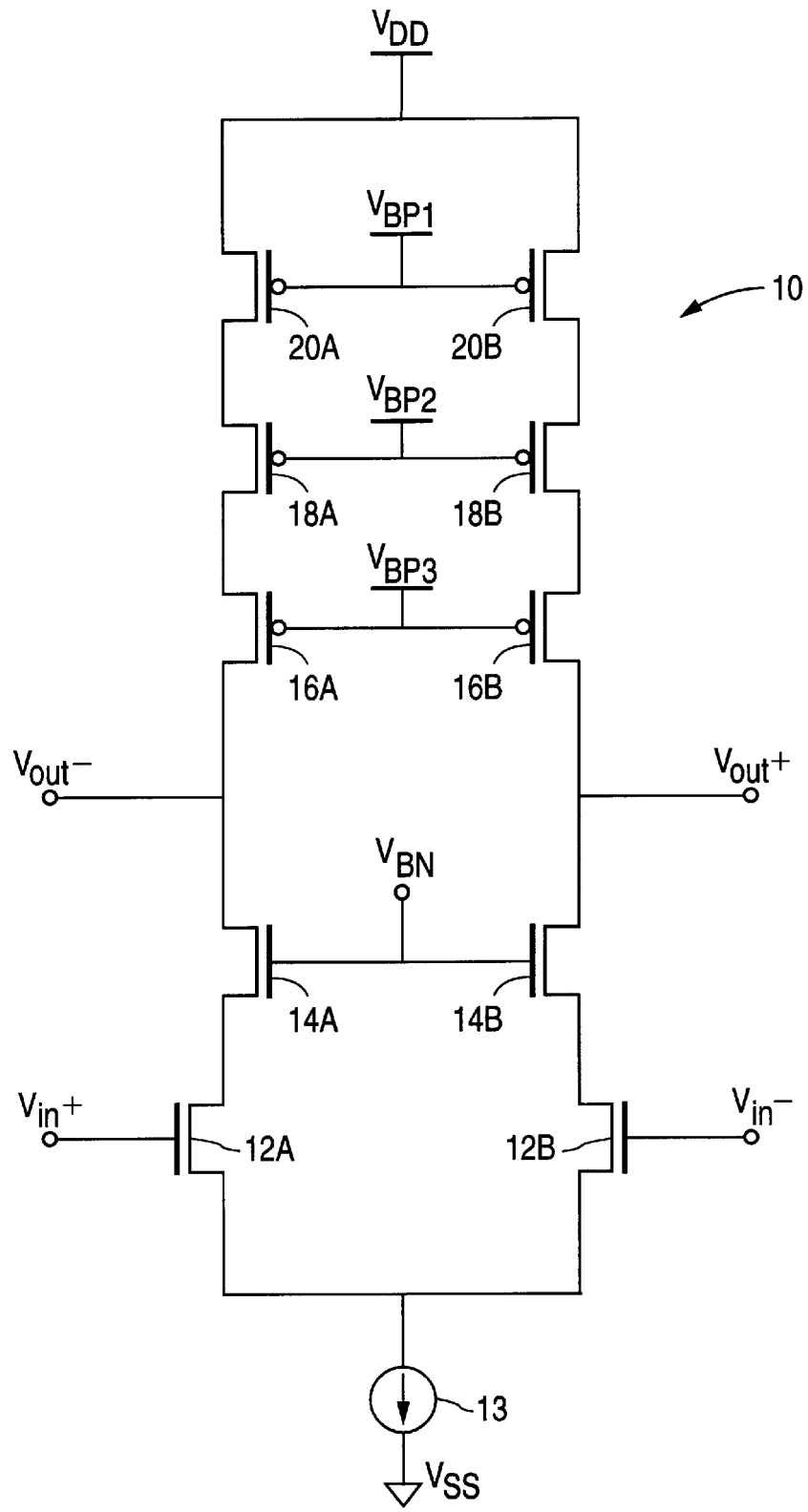
FIG. 1 is a schematic diagram of a conventional fully differential amplifier using an active load in the form of three stacked cascoded stages.

The gate voltage of load transistor 16A is a function of the current through the transistor and the source voltage. Since the current is relatively fixed by current source 13, it can be seen that boosting amplifier A1 operates to bias load transistor 16A. Gain boosting amplifier A2 functions to bias load transistor 16B in a similar manner. In this sense, it can be said that the gates of transistors 16A and 16B are biased independent of one another as compared, for example, to the prior art amplifier of FIG. 1 where the gates of each of the three transistor pairs that form the active load are connected directly to one another and biased by a common voltage source. It can also be said that the gates of transistors 16A and 16B are electrically isolated from one another.

In operation, amplifier 24 of FIG. 3 provides a differential output with a dynamic range comparable to that of amplifier 22 of FIG. 2 due to the reduced number of stacked transistors present in the active load. Furthermore, the gain of amplifier 24 is as high as that of amplifier 22 of FIG. 2. The speed of amplifier 24 when slewing is somewhat less than that of amplifier 22. Under slewing conditions, all of the current provided by source 13 is switched to one side of the amplifier so that there is a maximum amount of current available to charge and discharge the capacitances at the amplifier output. Transistors 22A and 22B increase this capacitance thereby decreasing the slew rate. However, as will be explained, transistors 22A and 22B significantly reduce the settling time of amplifier 24 as compared to amplifier 22.

Gain boosting amplifiers A1 and A2 generally have a relatively high output impedance and limited output capability for driving the gate-source and gate-drain capacitances of transistors 16A and 16B. This limited drive capability is partly due to the fact that the boost amplifiers are preferably single stage amplifiers which provides voltage gain. Multiple stage amplifiers are likely to adversely affect the overall stability of the differential amplifier. The boost amplifier drive capability could also be increased by increasing the current source 34 output $I_{BA}$ magnitude and the magnitude of the current produced by the current mirror circuit of transistors 28 and 30. However, this will increase the power requirements of the amplifier 24 which is undesirable particularly since such amplifiers are usually intended for use in low power applications.

The settling time of amplifier 24 is reduced by the presence of capacitor connected transistors 22A and 22B. When output Vout⁺ switches between maximum and minimum values, it is necessary to repeatedly charge and discharge the gate-source and gate-drain capacitances associated with transistor 16A. A significant amount of current is required to change the charge on the capacitances, particularly with respect to the gate-drain capacitance since the change in voltage across this capacitance is much larger than the change in voltage across the gate-source capacitance.

As previously noted, the output of amplifier A1 connected to the gate of load transistor 16A has limited drive capabilities. The current for rapidly charging and discharging the parasitic capacitances of transistor 16A is provided by capacitor-connected transistor 22A connected between the gate of transistor 16A and Vout⁺. Since outputs Vout⁺ and Vout⁻ are complementary signals, the change in voltage across transistor 22B is approximately equal and opposite to the change in gate-drain voltage across transistor 16A. Thus, by selecting the appropriate size of effective capacitance provided by transistor 22B it is possible to provide the appropriate amount of charge transferred to the parasitic capacitances of transistor 16A to facilitate rapid switching of the transistor. Capacitor-connected transistor 22A performs a similar function in providing a drive boost to transistor 16B during switching. As previously described, transistors 22A and 22B are preferably one-half the size as transistors 16A and 16B (one-half the channel width) so that the effective capacitance of transistors 22A and 22B is approximately equal to the gate-drain capacitance of transistors 16A and 16B.

Testing of the FIG. 3 amplifier 24 has confirmed that the overshoot of output Vout⁺ and Vout⁻ is substantially reduced. Although the extra loading attributable to capacitor-connected transistors 16A and 16B reduces the slew rate somewhat, once the amplifier reaches the small signal settling mode, the time required to reach within 250 $\mu$V of the final value is approximately 5 nanosecond faster than the response without the dynamic compensation. This represents a significant improvement, particularly in applications such as analog-to-digital converters where 250 $\mu$V may be the size of one LSB and 5 nanoseconds may constitute a substantial portion of the time available for conversion.

Figure 4B:
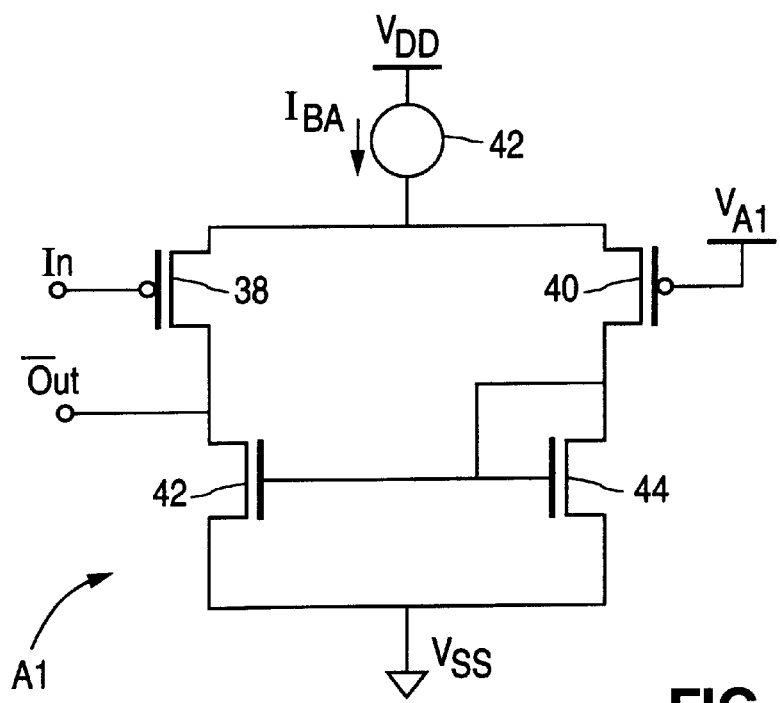

FIG. 4B shows an alternative gain boosting amplifier A1. P type transistors 38 and 40 form a differential pair connected in common to tail current source 42. The gate of transistor 40 is connected to a bias voltage $V_{A1}$, with the gate of transistor 38 forming the input In. N type transistors 42 and 44 form a current mirror load, with the drain of transistor 42 forming the output. The magnitude of input In relative to bias voltage $V_{A1}$, determines the manner in which current $I_{BA}$ is split between transistors 38 and 40. Load transistor 42 is capable of sinking a current at output $\overline{Out}$ equal to the amount of current in transistor 40 and transistor 38 is capable of sourcing a current equal to the difference between the current IBA and the current in transistor 40. Thus, when In goes high, transistor 38 conducts less current so that $\overline{Out}$ tends to go low and when In goes low, $\overline{Out}$ tends to go high.

One disadvantage of the FIG. 4B embodiment is that input In must be at a voltage no greater than $V_{DD}$ less the gate-source voltage drop across transistor 38 and the saturation voltage drop across current source 42. As a result, the voltage across load transistors 20A and 20B (FIG. 3) must be larger than otherwise necessary by an amount equal to the gate-source voltage drop of transistor 38. In addition to providing a gain boost, amplifier A1 of FIG. 4B is similar to that of FIG. 4A in that it operates to bias load transistor 16A independent of the biasing of load transistor 16B, with the respective gates being electrically isolated from one another. Similarly, amplifier A2, when constructed in accordance with FIG. 4B, operates to bias load transistor 16B independent of the biasing of load transistor 16A.

Thus, a differential amplifier having improved dynamic properties and capable of low voltage and low power operation has been disclosed. Although one embodiment has been described in some detail, changes can be made by those skilled in the art without departing from the spirit and scope of the invention as defined by the appended claims. By way of example, the disclosed embodiment utilizes P type transistors in the active load since P type transistors typically benefit more from the disclosed compensation as opposed to N type transistors which generally have improved performance characteristics. However, the present invention is applicable to complementary embodiments where the P and N types are interchanged as well as the polarity of the supply voltage.

What is claimed is:

1. A differential amplifier having a differential input and a differential output, said differential amplifier comprising:

first and second transistors of a first polarity having a common source connection, with the first and second transistors having respective gate electrodes which form the differential input;

a tail current source connected to the common source connection;

an active load which includes a first transistor of a second polarity, opposite the first polarity, which defines a first series path with the first transistor of the first polarity and a second transistor of the second polarity which defines a second series path with the second transistor of the first polarity, with a first output being defined at the first series path intermediate the first transistors of the first and second polarities and a second output being defined at the series path intermediate the second transistors of the first and second polarities, with gates of the first and second transistors of the second polarity being electrically isolated from one another;

a first compensation capacitor coupled between the gate of the first transistor of the second polarity and the second output; and a second compensation capacitor coupled between the gate of the second transistor of the second polarity and the first output.

2. The differential amplifier of claim 1 wherein the active load further includes a first gain boosting amplifier having an input coupled to a source of the first transistor of the second polarity and an output coupled to the gate of first transistor of the second polarity and a second gain boosting amplifier having an input coupled to a source of the second transistor of the second polarity and an output coupled to the gate of the second transistor of the second polarity.

3. The differential amplifier of claim 2 wherein the first and second compensation capacitors each include a transistor connected as a capacitor.

4. The differential amplifier of claim 3 wherein the transistors connected as a capacitor each have source and drains connected together to form a first terminal of the compensation capacitors and a gate to form a second terminal of the compensation capacitors.

5. The differential amplifier of claim 4 wherein the transistors connected as a capacitor have a channel width that is approximately one-half a channel width of the first and second transistors of the second polarity.

6. The differential amplifier of claim 5 wherein the first polarity transistors are N type transistors and the second polarity transistors are P type transistors.

7. The differential amplifier of claim 2 further including a third transistor of the first polarity having a gate connected to a bias voltage source and a drain and source connected to form part of the first series path intermediate the first output and the first transistor of the first polarity and a fourth transistor of the first polarity having a gate connected to a bias voltage and a drain and source connected to form part of the second series path intermediate the second output and the second transistor of the first polarity.

8. The differential amplifier of claim 7 wherein the active load further includes a third transistor of the second polarity having a gate connected to a bias voltage source and a drain and source connected to form part of the first series path intermediate a supply voltage source and the first transistor of the second polarity and a fourth transistor of the second polarity having a gate connected to a bias voltage source and a drain and source connected to form part of the second series path intermediate the supply voltage source and the second transistor of the second polarity.

9. An amplifier comprising:

a current source;

first and second N type transistors having sources coupled to the current source, with a drain and source of the first N type transistor defining part of a first current path and with a drain and source of the second N type transistor defining part of a second current path;

a first P type transistor having a drain and source which define part of the first current path intermediate a supply voltage source and the first N type transistor;

a second P type transistor having a drain and source which define part of the second current path intermediate the supply voltage source and the second N type transistor;

a first compensation capacitor connected between a gate of the first P type transistor and a node on the second current path intermediate the supply voltage source and the second N type transistor; and a second compensation capacitor connected between a gate of the second P type transistor and a node on the first current path intermediate the supply voltage source and the second N type transistor.

10. The amplifier of claim 9 further comprising a first gain boosting amplifier connected to increase a series impedance of the first P type transistor and a second gain boosting amplifier connected to increase a series impedance of the second P type transistor.

11. The amplifier of claim 10 wherein the first gain boosting amplifier is an inverting amplifier having an input connected to the source of the first P type transistor and an output connected to a gate of the first P type transistor and the second gain boosting amplifier is an inverting amplifier having an input connected to the source of the second P type transistor and an output connected to a gate of the second P type transistor.

12. A differential amplifier comprising:

first and second N type transistors having common source connections;

third and fourth N type transistor, with the third N type transistor defining a drain source path which is connected in series with a drain source path of the first N type transistor and with the fourth N type transistor defining a drain source path which is connected in series with a drain source path of the second N type transistor;

a first P type transistor having a drain source path connected in series with the drain source path of the first and third N type transistors;

a first gain boosting amplifier having an input connected to the source of the first P type transistor and an output connected to a gate of the first P type transistor;

a second P type transistor having a drain source path connected in series with the drain source path of the second and fourth N type transistors;

a second gain boosting amplifier having an input connected to the source of the second P type transistor and an output connected to a gate of the second P type transistor;

a first compensation capacitor connected between the gate of the first P type transistor and a node intermediate the fourth N type transistor and the second P type transistor; and a second compensation capacitor connected between the gate of the second P type transistor and a node intermediate the third N type transistor and the first P type transistor.

13. The amplifier of claim 12 further comprising a third P type transistor having a drain source path connected in series with the drain source path of the first P type transistor and connected between the first P type transistor and a supply voltage source and a fourth P type transistor having a drain source path connected in series with the drain source path of the second P type transistor and connected between the second P type transistor and the supply voltage source.

14. A method of compensating a differential amplifier having a differential pair of input transistors and an active load for the differential pair of input transistors, with the active load including first and second load transistors, said method comprising:

electrically isolating gates of the first and second load transistor from one another;

coupling a first compensation capacitor between a first output of the differential amplifier and the gate of the first load transistor; and coupling a second compensation capacitor between a second output of the differential amplifier and the gate of the second load transistor.

15. A method of compensating a differential amplifier having a differential pair of input transistors and an active load for the differential pair of input transistors, with the active load including first and second load transistors, said method comprising:

electrically isolating gates of the first and second load transistor from one another;

coupling a first compensation capacitor between the gate of the first load transistor and a first node having a voltage swing which is of a polarity opposite to a voltage swing on a drain of the first load transistor; and coupling a second compensation capacitor between the gate of the second load transistor and a second node having a voltage swing which is of a polarity opposite to a voltage swing on a drain of the second load transistor.

16. The method of claim 15 wherein the first node is the drain of the second load transistor and the second node is the drain of the first load transistor.

* * * * *